United States Patent
Vakhshoori et al.

(10) Patent No.: US 6,795,477 B1
(45) Date of Patent: Sep. 21, 2004

(54) METHOD FOR MODULATING AN OPTICALLY PUMPED, TUNABLE VERTICAL CAVITY SURFACE EMITTING LASER (VCSEL)

(75) Inventors: Daryoosh Vakhshoori, Cambridge, MA (US); Parviz Tayebati, Boston, MA (US)

(73) Assignee: Cortek Inc.

( * ) Notice: Subject to any disclaimer, the term of this patent is extended or adjusted under 35 U.S.C. 154(b) by 262 days.

(21) Appl. No.: 09/639,678

(22) Filed: Aug. 11, 2000

Related U.S. Application Data

(60) Provisional application No. 60/148,629, filed on Aug. 12, 1999.

(51) Int. Cl.[7] .............................. H01S 5/00; H01S 3/08; H01S 3/09
(52) U.S. Cl. .............................. 372/96; 372/98; 372/75; 372/69; 372/44; 372/45; 372/46; 372/50
(58) Field of Search .............................. 372/96, 98, 75, 372/69, 44, 45, 46, 50, 26, 20, 43, 70

(56) References Cited

U.S. PATENT DOCUMENTS

| | | | | |
|---|---|---|---|---|
| 5,295,209 A | * | 3/1994 | Huber .......................... | 385/37 |
| 5,914,976 A | * | 6/1999 | Jayaraman et al. ........... | 372/50 |
| 5,933,444 A | | 8/1999 | Molva et al. ................. | 372/75 |
| 5,991,318 A | | 11/1999 | Caprara et al. ............... | 372/22 |
| 5,991,326 A | * | 11/1999 | Yuen et al. ................... | 372/96 |
| 6,088,376 A | | 7/2000 | O'Brien ........................ | 372/50 |
| 6,285,704 B1 | * | 9/2001 | Kullander-Sjoberg et al. ... | 372/96 |

* cited by examiner

Primary Examiner—Jerome Jackson
Assistant Examiner—Joseph Nguyen
(74) Attorney, Agent, or Firm—Steubing McGuinness & Manaras LLP

(57) ABSTRACT

A method for modulating the output of an optically pumped, tunable VCSEL. Two approaches are disclosed. In a first approach, the output of the VCSEL is modulated by modulating the pump laser. In a second approach, the output of the VCSEL is modulated by modulating a voltage applied across the active region.

4 Claims, 3 Drawing Sheets

METHOD FOR MODULATING AN OPTICALLY PUMPED, TUNABLE VERTICAL CAVITY SURFACE EMITTING LASER (VCSEL)

REFERENCE TO PENDING PRIOR PATENT APPLICATION

This patent application claims benefit of pending prior U.S. Provisional Patent Application Serial No. 60/148,629, filed Aug. 12, 1999 by Daryoosh Vakhshoori and Parviz Tayebati for MODULATION METHODS OF OPTICALLY PUMPED TUNABLE VERTICAL CAVITY SURFACE EMITTING LASERS, which patent application is hereby incorporated herein by reference.

FIELD OF THE INVENTION

This invention relates to photonic devices in general, and more particularly to tunable lasers.

BACKGROUND OF THE INVENTION

In pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, and in pending prior U.S. patent application Ser. No. 09/543,31, filed Apr. 5, 2000 by Peidong Wang et al. for SINGLE MODE OPERATION OF MICROMECHANICALLY TUNABLE, HALF-SYMMETRIC, VERTICAL CAVITY SURFACE EMITTING LASERS, which patent applications are hereby incorporated herein by reference, there are disclosed tunable Fabry-Perot filters and tunable vertical cavity surface emitting lasers (VCSEL's).

More particularly, and looking now at FIG. 1, there is shown a tunable vertical cavity surface emitting laser (VCSEL) 5 formed in accordance with the aforementioned U.S. patent applications Ser. Nos. 09/105,399 and 09/543, 318. VCSEL 5 generally comprises a substrate 10, a bottom mirror 20 mounted to the top of substrate 10, a gain medium (or "active region") 23 mounted to the top of bottom mirror 20, a bottom electrode 15 mounted to the top of grain medium. 23, a thin support 25 atop bottom electrode 15, a top electrode 30 fixed to the underside of thin support 25, a reinforcer 35 fixed to the outside perimeter of thin support 25, and a confocal top mirror 40 set atop thin support 25, with an air cavity 45 being formed between bottom mirror 20 and top mirror 40.

As a result of this construction, when active region 23 is appropriately stimulated, e.g., by optical pumping or electrical current, lasing can be established within air cavity 45, between top mirror 40 and bottom mirror 20. Furthermore, by applying an appropriate voltage across top electrode 30 and bottom electrode 15, the position of top mirror 40 can be changed relative to bottom mirror 20, whereby to change the length of the laser's resonant cavity, and hence tune VCSEL 5.

The present invention is directed to VCSEL's which are constructed so as to have their active region stimulated by optical pumping.

OBJECTS OF THE INVENTION

The primary object of the present invention is to provide a novel method for modulating the output of an optically pumped, tunable VCSEL.

Another object of the present invention is to provide a novel method for modulating the output of an optically pumped, tunable VCSEL by modulating the pump laser.

And another object of the present invention is to provide a novel method for modulating the output of an optically pumped, tunable VCSEL by modulating a voltage applied across the active region.

SUMMARY OF THE INVENTION

These and other objects are addressed by the present invention.

In one form of the invention, there is provided a method for modulating the output of an optically pumped, tunable VCSEL, wherein the method comprises the steps of: (1) optically pumping the VCSEL with a pump laser so as to cause the VCSEL to generate an output; and (2) modulating the output light power of the pump laser so as to modulate the carrier population in the VCSEL's active region whereby to modulate the output of the VCSEL.

In another form of the invention, there is provided a method for modulating the output of an optically pumped, tunable VCSEL, wherein the method comprises the steps of: (1) optically pumping the VCSEL with a pump laser so as to cause the VCSEL to generate an output; and (2) applying a voltage across the active region so as to alter the optical power circulating in the VCSEL's cavity, whereby to increase or decrease the output power of the VCSEL.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

The present invention provides two ways for modulating the output of an optically pumped, tunable vertical cavity surface emitting laser (VCSEL).

Figure 1:
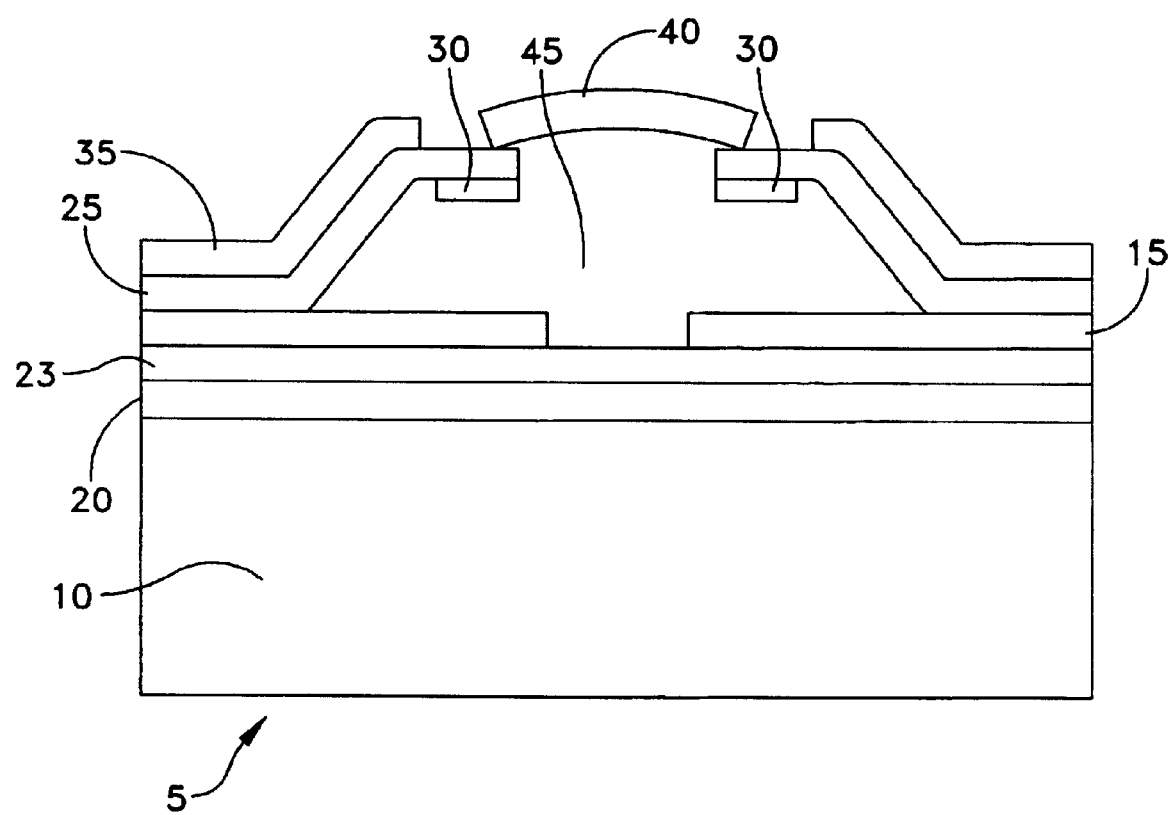
FIG. 1 is a schematic side view of a tunable VCSEL.
Figure 2:
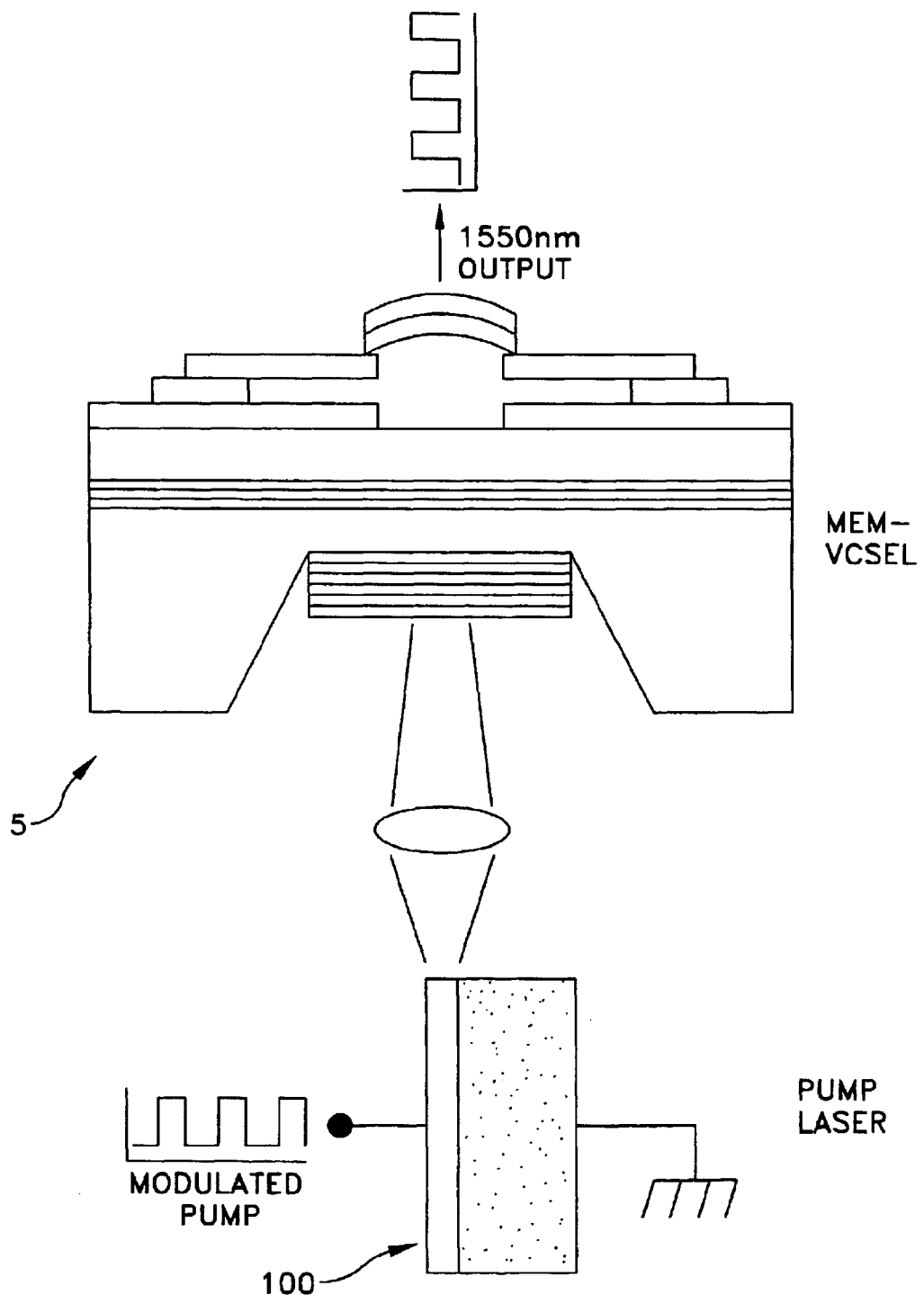
FIG. 2 is a schematic diagram showing the output of an optically pumped, tunable VCSEL being modulated by modulating the pump laser.

In the first approach, the pump laser is directly modulated in the manner shown in FIG. 2. More particularly, the pump laser 100 is imaged on the active region of VCSEL 5. The pump laser can be of the 980 nm or 1400–1500 nm variety, and is typically of edge-emitting geometry. As the output light power of the pump laser 100 is modulated, the carrier population in the VCSEL's active region is also modulated. This in turn results in modulation of the output of VCSEL 5.

Figure 3:
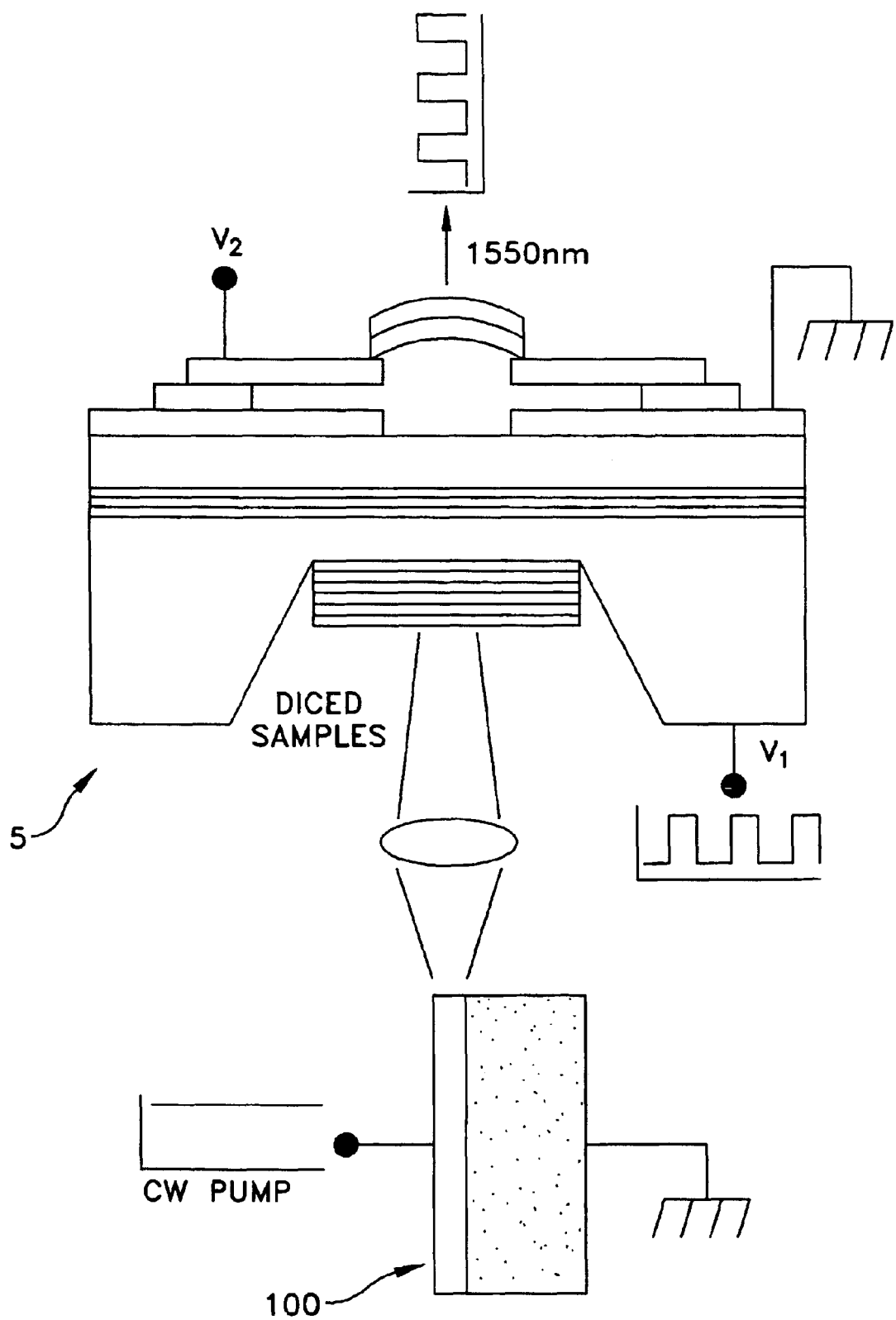
FIG. 3 is a schematic diagram showing the output of an optically pumped, tunable VCSEL being modulated by modulating a voltage applied across the VCSEL's active region.

In the second approach, the P-N junction of the VCSEL's active region is either forward or reverse biased to modulate the output of VCSEL 5. This is schematically illustrated in FIG. 3. More particularly, in this approach, the pump laser 100 is operated in CW mode and biases the VCSEL's output to a DC level. Then the application of the voltage $V_2-V_1$ across the active region will add to, or subtract from, the optical power circulating in the VCSEL's cavity, resulting in an increase, or decrease, in the output power of VCSEL 5.

Modifications

It is to be understood that the present invention is by no means limited to the particular constructions and method steps disclosed above and/or shown in the drawings, but also comprises- any modifications or equivalents within the scope of the claims.

What is claimed is:

1. A method for modulating the output of an optically pumped, tunable VCSEL, wherein said method comprises optically pumped, tunable VCSEL having a top face in communication with an active region of the VCSEL and a bottom face, wherein said method comprises the steps of:
   (1) optically pumping the VCSEL by directing an output from a pump laser on the bottom face of the VCSEL so as to cause the VCSEL to generate a first output having an output power greater than zero; and
   (2) modulating the output light power of the pump laser so as to modulate the carrier population in the VCSEL's active region, and thereby modulate the output of the VCSEL to a second output having an output power greater than zero.

2. A method for modulating the output of an optically pumped, tunable VCSEL having a top face in communication with an active region of the VCSEL and a bottom face, wherein said method comprises the steps of:
   (1) optically pumping the VCSEL by directing an output from a pump laser at the bottom face of the VCSEL so as to cause the VCSEL to generate an output; and
   (2) applying a voltage across the VCSEL's active region so as to alter the optical power circulating in the VCSEL's cavity, to control the output power of the VCSEL.

3. A tunable vertical cavity surface emitting laser (VCSEL) comprising:

a VCSEL comprising:
      a substrate;
      a bottom mirror mounted on top of the substrate;
      an active region mounted on top of the bottom mirror;
      a support disposed on the active region the support including a top mirror, wherein an air cavity is formed between the bottom mirror and the top mirror; and
      a pump laser, directed at a bottom face of the substrate, the pump laser for providing light power at the bottom face of the substrate to cause the active region to provide an output for the VCSEL, the pump laser being modulateable to provide a modulated VCSEL output.

4. The tunable VCSEL of claim 3 further comprising:

a bottom electrode mounted on top of the active region;

a top electrode mounted on the support; and means for providing a voltage across the top and bottom electrode to modulate the output of the VCSEL.

* * * * *